United States Patent
Markl et al.

(10) Patent No.: US 7,372,266 B2
(45) Date of Patent: May 13, 2008

(54) EDDY CURRENT COMPENSATION WITH N-AVERAGE SSFP IMAGING

(75) Inventors: Michael Markl, Freiburg (DE); Jochen Leupold, Freiburg (DE)

(73) Assignee: Universitätsklinikum Freiburg, Freiburg (DE)

( * ) Notice: Subject to any disclaimer, the term of this patent is extended or adjusted under 35 U.S.C. 154(b) by 0 days.

(21) Appl. No.: 11/296,727

(22) Filed: Dec. 7, 2005

(65) Prior Publication Data

US 2006/0125476 A1 Jun. 15, 2006

(30) Foreign Application Priority Data

Dec. 15, 2004 (DE) ...................... 10 2004 060 768

(51) Int. Cl.
*G01V 3/00* (2006.01)
(52) U.S. Cl. ...................................................... 324/307
(58) Field of Classification Search ........ 324/300–322; 600/410–435
See application file for complete search history.

(56) References Cited

U.S. PATENT DOCUMENTS

| | | | |
|---|---|---|---|
| 4,699,148 A | 10/1987 | Gyngell | |
| 5,652,514 A * | 7/1997 | Zhang et al. | 324/307 |
| 6,624,630 B1 * | 9/2003 | Foxall | 324/307 |
| 6,677,750 B2 * | 1/2004 | Hennig et al. | 324/307 |
| 6,714,807 B2 * | 3/2004 | Zur | 600/410 |
| 6,856,134 B1 * | 2/2005 | Reeder et al. | 324/309 |
| 2004/0004476 A1 | 1/2004 | Overall | |

FOREIGN PATENT DOCUMENTS

| | | |
|---|---|---|
| DE | 100 40 850 A1 | 3/2002 |
| DE | 101 12 704 A1 | 10/2002 |
| EP | 1 363 136 A2 | 11/2003 |

OTHER PUBLICATIONS

M. Markl; J. Leupold; O. Bieri; K. Scheffler; and J. Hennig, "Double Average Parallel Steady-State Free Precession Imaging: Optimized Eddy Current and Transient Oscillation Compensation", Magnetic Resonance in Medicine, Bd. 54, 2005, pp. 965-974, Wiley-Liss, Inc.

Michael Markl; Scott B. Reeder; Frandics P. Chan; Marcus T. Alley; Robert J. Herfkens; Norbert J. Pelc, "Steady State Free Precession MR Imaging: Improved Myocardial Tag Persistence and Signal-to-Noise Ratio for Analysis of Myocardial Motion", Radiology, Bd. 230, Mar. 2004, vol. 230, No. 3; pp. 852-861.

(Continued)

*Primary Examiner*—Brij Shrivastav
*Assistant Examiner*—Dixomara Vargas
(74) *Attorney, Agent, or Firm*—Walter A. Hackler

(57) ABSTRACT

A method according to the technique of a steady state free precession (SSFP) gradient echo method, in particular, of nuclear magnetic resonance (NMR) tomography, wherein a regular sequence of radio frequency pulses with flip angle α is applied at temporally constant intervals TR, wherein the phase of these pulses is increased in subsequent steps by a constant phase increment, is characterized in that a predetermined phase encoding scheme is performed in such a manner that each individual phase encoding step is identically repeated N times under the following conditions:

N is an even number and $N \geq 2$;
successive measured NMR signals are averaged,
which minimizes the artefacts produced due to incrementation of the phase encoding gradients.

19 Claims, 5 Drawing Sheets

OTHER PUBLICATIONS

H.A. Ward, J.A. Polzin, M.A. Bernstein, B.E. Hoppel, "In/Out Elliptic Centric View Ordering and Modulated Phase-Cycliing for Reduced Motion Artifact in Phase-Cycled SSFP", Proc. Intl. Soc. Mag. Reson. Med. 11, 2003, p. 295.

G.S. Slavin, D.W. Rettmann, C. Azevedo, K.C. Wu, "FIESTA-SP: High-Temporal-Resolution 2D Cine MR Imaging of the Entire Heart in a Single Breath-Hold", Proc. Intl. Soc. Mag. Reson. Med. 11 (2004) p. 1957.

O. Bieri, K. Scheffler, "Generic eddy-current compensation in balanced steady-state free precession", Proc. Intl. Soc. Mag. Reson. Med. 11 (2004), S. 104.

P. Spincemaille et al., "View ordering for magnetization prepared steady state free precession acquisition: application in contrast-enhanced MR angiography", Magn. Reson. Med. 52 (Sep. 2004), S. 461-466.

K. Scheffler, J. Hennig, "Eddy-current optimized phase encoding schemes to reduce artifacts in balanced SSFP imaging", Proc. Intl. Soc. Mag. Reson. Med. 11 (2003), S. 294.

Carr HY. Steady-State Free Precession in Nuclear Magnetic Resonance. Physical Review 1958;112(5):1693-1701.

Oppelt A, Graumann R, Barfuss H, Fischer H, Hartl W, Schajor W. FISP—a new fast MRI sequence. Electromedia (Engl Ed) 1986; 54(54):15-18.

Scheffler K, Lehnhardt S. Principles and applications of balanced SSFP techniques. Eur Radiol 2003;13(11):2409-2418.

Foxall DL. Frequency-modulated steady-state free precession imaging. Magn Reson Med 2002;48(3):502-508.

Bieri O, Scheffler K, In Proc. Intl. 12th Scientific Meeting International Society of Magnetic Resonance in Medicine, Kyotzo, Japan, 2004, No. 104.

Pruessmann KP, Weiger M, Scheidegger MB, Boesiger P. SENSE: sensitivity encoding for fast MRI. Magn Reson Med 1999; 42(5):952-962.

Griswold MA, Jakob PM, Heidemann RM, Nittka M, Jellus V, Wang J, Kiefer B, Haase A. Generalized autocalibrating partially parallel acquisitions (GRAPPA). Magn Reson Med 2002;47(6):1202-1210.

Scheffler K, Heid O, Hennig J, Magnetization preparation during the steady state: fat-saturated 3D TrueFISP. Magn Reson Med 2001; 45(6):1075-1080.

* cited by examiner

EDDY CURRENT COMPENSATION WITH N-AVERAGE SSFP IMAGING

This application claims Paris Convention priority of 10 2004 060 768.0 filed on 15 Dec. 2004, the complete disclosure of which is hereby incorporated by reference.

BACKGROUND OF THE INVENTION

The invention concerns a method according to the technique of a Steady State Free Precession (SSFP) gradient echo method, in particular, of nuclear magnetic resonance (NMR) tomography, wherein a regular sequence of radio frequency pulses with flip angle α is applied at constant time intervals TR, wherein the phase of these pulses is increased in successive steps by a constant phase increment.

SSFP Imaging

An SSFP signal is generated by a continuous sequence of radio frequency pulses and was introduced by Carr already in 1958 [1]. Carr was able to show that implementation of the method with equidistant radio frequency pulses with constant amplitude and alternating phase produces an SSFP signal of on-resonance spins with particularly high signal intensity.

In 1986, this principle was transferred to an MR imaging method in the form of the FISP method (today called TrueFISP) [2]. All gradients are switched in such a manner that their integral from the center of a pulse to the center of the next pulse is zero. Successive pulses have flip angles α and alternating phases: P1, P3, P5 . . . =α, P2, P4, P6 . . . =−α. The time distance between two pulses is called repetition time TR (see FIG. 2).

One problem with its implementation is the fact that the incrementation of phase encoding gradients which is required for imaging can produce temporally variable eddy current effects and hence signal fluctuations. In particular, in SSFP applications with non-linear data acquisition (k space scanning) and consequently large amplitude jumps of neighboring phase encoding steps, this sensitivity of SSFP imaging to eddy current effects produces strong artefacts in the MRT image (FIG. 1) [3, 4].

Eddy Current Suppression

These signal fluctuations which are induced by eddy currents can be suppressed by adjusting the k space scanning in such a manner that a directly neighboring phase encoding step is read-out prior to each major k space jump ("paired phase encoding") [5].

The suppression of signal modulation can be explained by the fact that the SSFP signal is determined by the production of a dual steady state configuration. A certain arrangement of the signal-producing magnetization is thereby mapped to each other in successive RF excitations. By changing the gradient amplitudes for phase encoding in successive RF excitations, the MRT signal phase induced by eddy currents is changed, which can disturb said mapping of the dual steady state magnetization configurations to each other. This configuration disturbance results in termination of the SSFP steady state, thereby causing signal fluctuations and image artefacts.

This formation of image artefacts and disturbance of the dual steady state configuration with the use of incremental phase encoding is also shown in FIG. 3B. FIG. 3B shows the temporal development of the transverse component of the MRT magnetization vector in the steady state for two successive data acquisition intervals ((1)->(2) and (3)->(4)) and RF excitations with flip angles α(rf(+α) and rf(−α)).

The temporal development of the MRT signal and associated potential signal oscillations are determined by the temporal development of position and absolute value of the magnetization vector. The transverse magnetization is not mapped to itself due to different phase encoding steps and therefore different signal phases ($\Delta\phi_{eddy,I}$ and $\Delta\phi_{eddy,II}$) induced by eddy currents after two data acquisition intervals and RF excitations ((4)->(1')) instead of (1)). The dual configuration of the SSFP steady state is thereby disturbed, producing signal fluctuations and image artefacts.

In the "paired phase encoding" acquisition strategy, phase encoding gradient differences are minimized in pairs to ensure that there are none or only minimum differences in pairs in the signal phases induced by the eddy currents. As a result, any eddy current phase can be compensated for either completely or partially during the subsequent excitation.

Data recording with "paired phase encoding" therefore reduces the eddy current artefacts but permits no complete compensation since the pairwise successive phase encoding steps still have a small gradient amplitude difference and can therefore produce different signal phases induced by eddy currents (see also FIG. 3B).

The best results are obtained with so-called on-resonance spins which do not experience any additional phase changes during TR. It has turned out, however, that the eddy current sensitivity, i.e. the incomplete compensation of eddy current effects, of the method increases with the local off-resonance frequency, i.e. the field inhomogeneity, in the tissue to be examined.

In MRT applications, this condition is, however, not met even for very small repetition times TR, wherein the shortest achievable TR is substantially determined by the switching speeds of the magnetic field gradients. Due to the magnetic field inhomogeneities, the spins are dephased to a certain degree by a phase angle $\Delta\phi$ between two excitations. For TR=4 ms, $\Delta\phi$=90° for an off-resonance frequency $\Delta\Omega$ of $\Delta\phi/(TR*360°)$=66 Hz. This corresponds to an inhomogeneity of 1 ppm for a resonance frequency of 63 MHz with 1.5 tesla field strength. These inhomogeneities cannot be prevented in applications on human beings due to the arising susceptibility effects and local variations of the chemical shift.

Further MR methods which are relevant for the inventive method, relate to the acceleration of MRT imaging with parallel imaging [6, 7] and on the interruption of the SSFP steady state using "Steady State Storage" [8]. The latter is a method which permits insertion of preparation sequences (e.g. for fat saturation) into an SSFP measurement in such a manner that artefacts due to interruption of the steady state are reduced. However, the best results with this method are also achieved for so-called on-resonance spins, whereby the artefact sensitivity, i.e. non-ideal "Steady State Storage" increases with the local off-resonance, i.e. with the field inhomogeneity in the tissue to be examined.

It is the underlying purpose of the invention to propose a method which minimizes the artefacts produced through incrementation of phase encoding gradients.

Optimized eddy current compensation (N-average SSFP imaging)

BRIEF DESCRIPTION OF THE DRAWINGS

Further advantages of the invention can be extracted from the description and the drawing. The features mentioned above and below may be used individually or collectively in arbitrary combination. The variants shown and described are not to be understood as exhaustive enumeration but have exemplary character for describing the invention.

SUMMARY OF THE INVENTION

This object is achieved in accordance with the invention by performing a predetermined phase encoding scheme in such a manner that each individual phase encoding steps is identically repeated N times under the following conditions:

N is an even number and N≧2, i.e. (N=2, 4, 6, 8, . . . );
successive measured NMR signals are averaged.

In the inventive method, the k space scanning, i.e. the temporal sequence of successive phase encoding steps, is changed in a steady state sequence with flip angles α and alternating phase in such a manner that compensation of eddy current effects is optimized, wherein, in the preferred implementation, the following features are met:

A predetermined phase encoding scheme is performed in such a manner that each individual phase encoding step is identically repeated N times, and the MR signals measured thereby are averaged, wherein N must be an even number and larger or equal to two ((N average SSFP imaging, N=2, 4, 6, 8, . . . ).

In the simplest case, the individual phase encoding steps are each acquired two times (N=2, double average SSFP imaging) to obtain ideal eddy current compensation, thereby doubling the overall measuring time.

The method is independent of the previous history of phase encoding and can be applied to any phase encoding schemes.

DETAILED DESCRIPTION

Figure 1B:
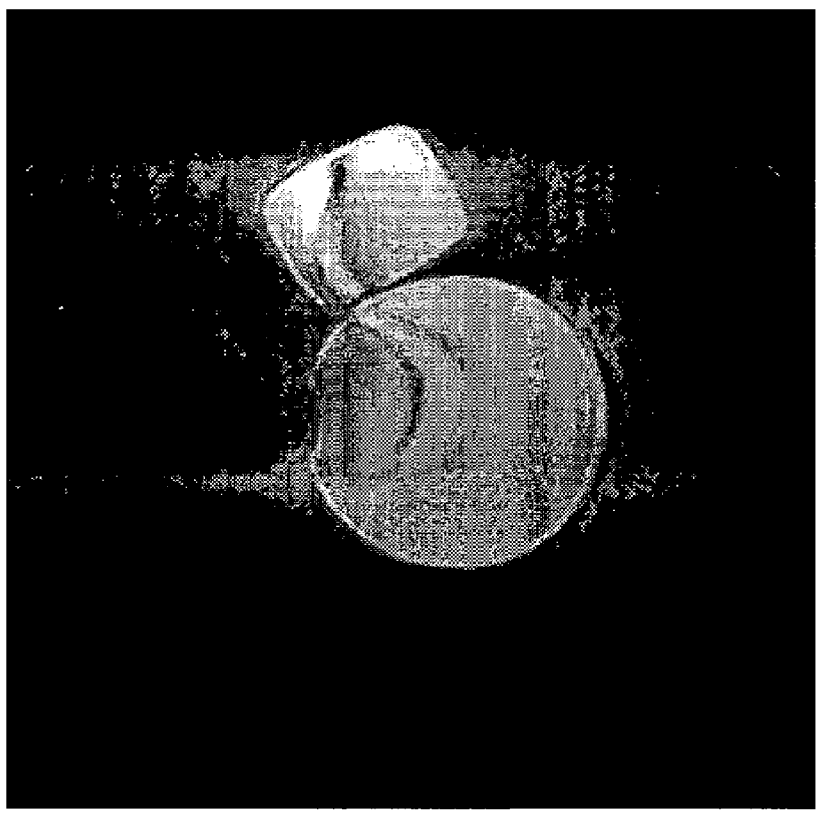
FIGS. 1A and 1B show SSFP imaging on a phantom. Compared with linear phase encoding (FIG. 1A), eddy current artifacts with reversely centric k-space scanning (FIG. 1B) produce signal fluctuations and strong image artifacts.
Figure 1A:
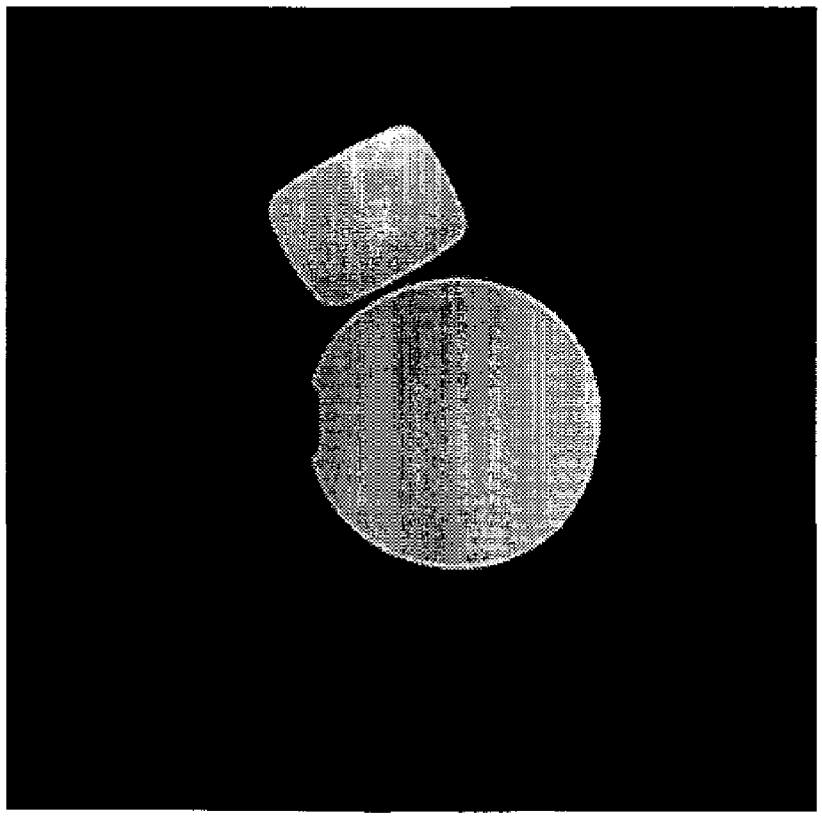
Figure 2:
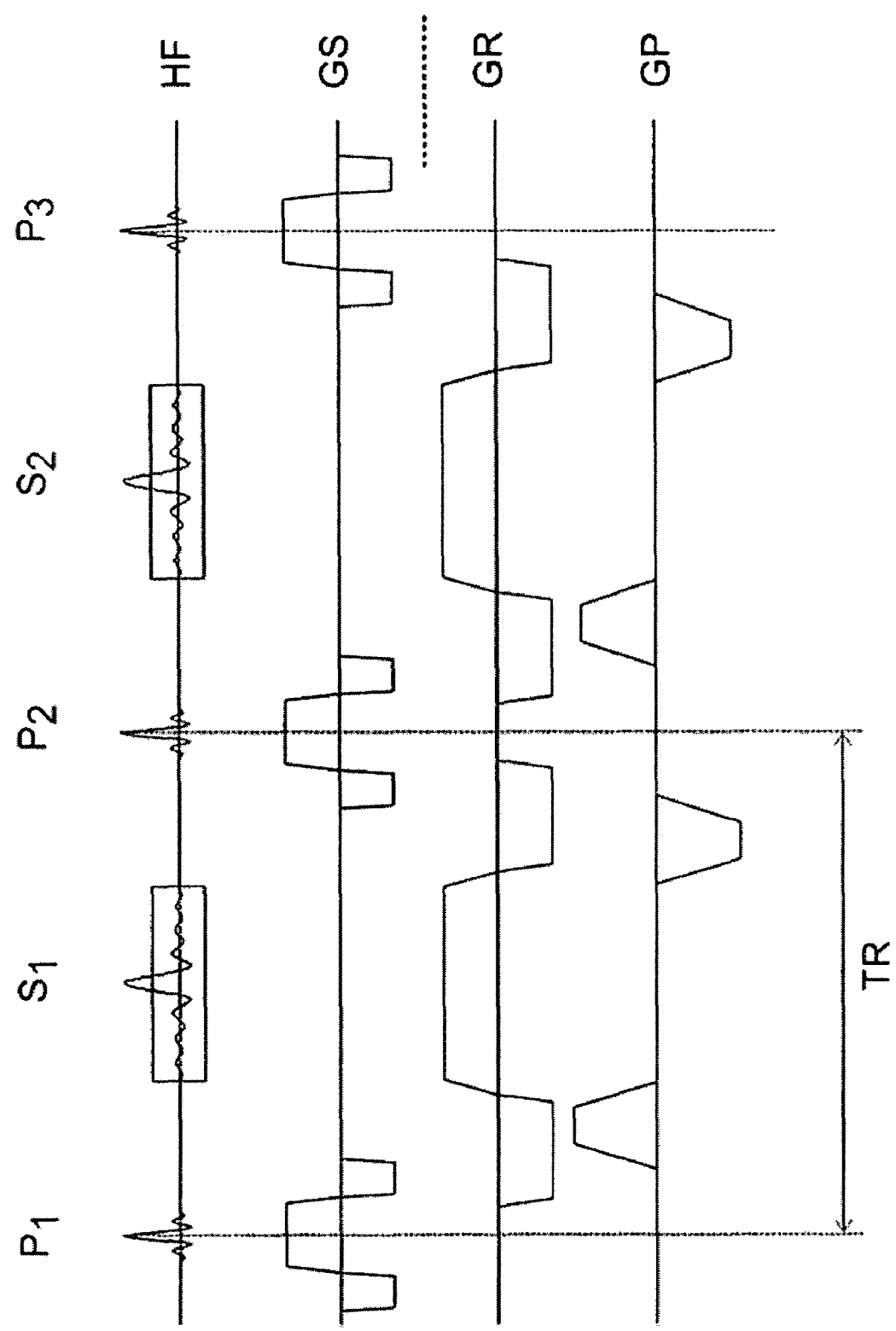
FIG. 2 shows a scheme of an SSFP sequence: HF, GS, GR and GP designate the radio frequency pluses P1, P2, P3, . . . , the signals S1, S2, . . . , GS designate the slice selection gradient, GR designates the read gradient, and GP designates the phase encoding gradient.
Figure 3A:
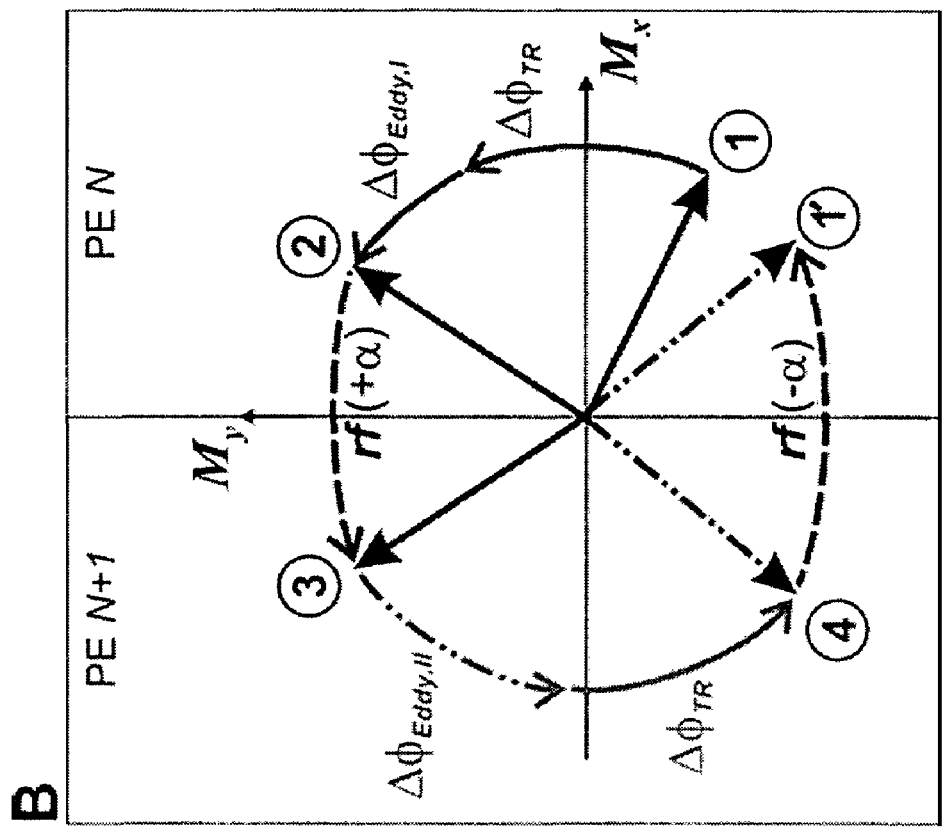
FIG. 3A shows a method for ideal compensation of eddy current effects in MRT imaging with SSFP. The transverse component of the magnetization vector ($M_{xy}$, black arrows) which is responsible for MRT signal generation, is again identically mapped on itself ((4)->(1)) after two successive data acquisition intervals ((1)->(2) and (3)->(4)) and RF excitations (rf(+α) and rf(−α)) despite signal phases ($\Delta\Phi_{eddy}$) induced by eddy currents. The dual configuration of the SSFP steady state is maintained and artifacts are prevented.
Figure 3B:
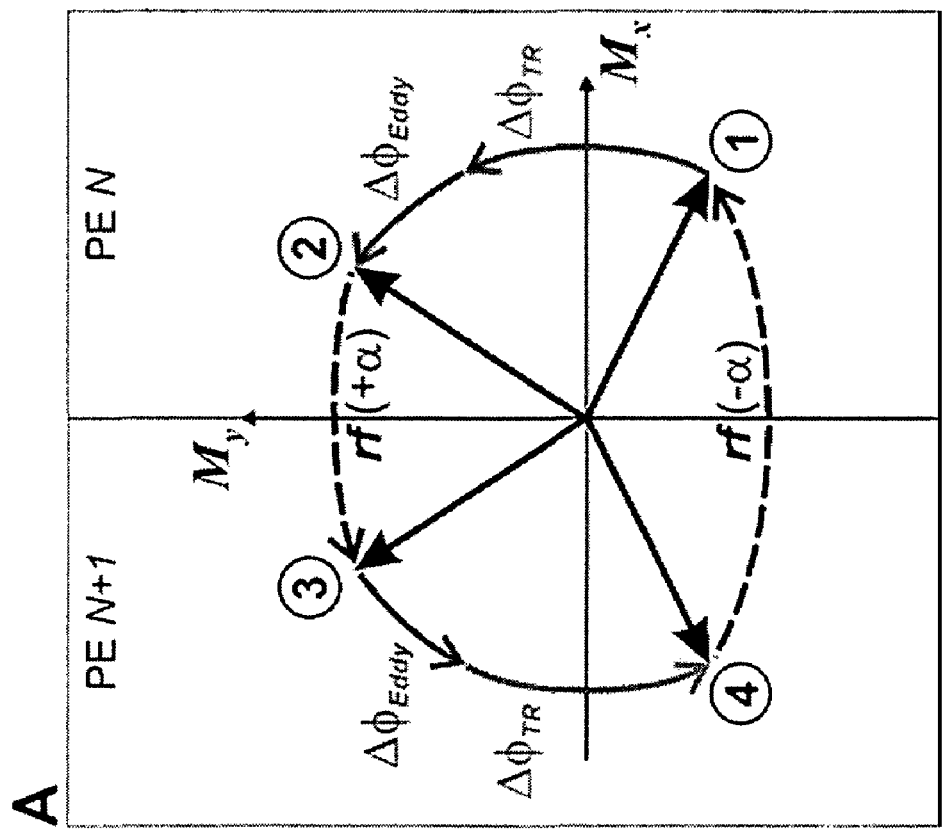
FIG. 3B shows the generation of image artifacts and disturbance of the dual steady state configuration with the use of incremental phase encoding. The transverse component of the magnetization vector ($M_{xy}$, black arrows) is not mapped on itself ((4)->(1')) instead of (1)) after two data acquisition intervals ((1)->(2) and (3)->(4)) and RF excitations (rf(+α) and rf(−α)) due to different phase encoding steps and therefore different signal phases ($\Delta\Phi_{eddy,I}$ and $\Delta\Phi_{eddy,II}$) induced by eddy currents. The dual configuration of the SSFP steady state is thereby disturbed, producing signal fluctuations and image artifacts.

FIG. 3A also shows the function in case of ideal eddy current correction for N=2 (double average SSFP imaging). FIG. 3A shows the temporal development of the transverse component of the MRT magnetization vector in the steady state for two successive data acquisition intervals ((1)->(2) and (3)->(4)) and RF excitations with flip angle α(rf(+α) and rf(−α)). The temporal development of the MRT signal and associated potential signal oscillations are determined by the temporal development of position and absolute value of the magnetization vector. The paired acquisition of identical phase encoding amplitudes reproduces identical signal phases ($\Delta\phi_{eddy}$) induced by eddy currents in successive data acquisition intervals. These analogously add up to the temporally constant signal phases from off-resonances ($\Delta\phi_{TR}$) in both configurations of the dual steady state such that the dual magnetization configurations are identically transferred into one another despite of eddy current effects. The dual configuration of the SSFP steady state remains and signal fluctuations, i.e. image artefacts, are largely prevented. Signal averaging has an additional smoothing effect in case of signal oscillations of successive phase encoding steps.

If a different phase encoding gradient is selected in the next step, the signal phase induced by now changed eddy currents can be compensated again through repeated acquisition with identical phase encoding amplitude.

The method can be combined also with other imaging methods which are based on SSFP imaging. Phase encoding can thereby also be performed in a three-dimensional phase encoding method in addition to the frequently applied two-dimensional Fourier transformation. It is also possible to realize multi-slice acquisition through sequential excitation of parallel layers to obtain images of corresponding contrast.

The inventive method can be transferred also to methods, wherein the images are encoded according to other methods such as e.g. filtered back projection. The magnetic field gradients are thereby applied in correspondence with image encoding according to the method of filtered back projection.

Ideal Eddy Current Compensation and Parallel SSFP Imaging

In a preferred variant of the inventive method, in addition to the radio frequency pulse sequence, magnetic field gradients are applied for encoding an NMR image corresponding to a two-dimensional or even multi-dimensional Fourier transformation method in such a manner that a slice is selected through application of a slice selection gradient during the radio frequency pulses, a gradient echo is generated through application of a read gradient which is initially switched on in terms of a gradient echo method and the amplitude of which is then reversed, before reading out the gradient echo, phase encoding is performed through application of a phase encoding gradient perpendicularly to the read gradient in terms of a two-dimensional Fourier transformation method or through application of several phase encoding gradients in perpendicular directions for phase encoding in terms of a multi-dimensional Fourier transformation method.

The inventive method is extended or optimized to obtain data acquisition with parallel imaging in addition to changing the temporal sequence of successive phase encoding steps (N-average SSFP imaging).

In an advantageous manner, the N-fold measuring time extension which is inherent in the method is completely or partially compensated for by an acceleration factor M through application of parallel imaging.

The acceleration factor (M) selected for parallel imaging is independent of the number of signal averagings (N) and can be selected in such a manner that the measuring time extension inherent in the N-average method can be completely or partially compensated for.

The preferred implementation thereby shows the following features:

in case of N-fold identical repetition of each phase encoding step, the N-fold measuring time extension is reduced by a factor M through application of parallel imaging with an acceleration factor;

in the simplest case, the acceleration factor is selected as M=2 while doubling the individual phase encoding steps (N=2, double average SSFP imaging) such that the measuring time extension is completely compensated for, wherein the signal-to-noise ratio and the spatial resolution remain the same as in the standard SSFP imaging method.

The method is independent of the method selected for parallel imaging and can be combined with the conventional techniques (SENSE, GRAPPA).

Reduction of Steady State Storage Artefacts

The inventive method can also be combined with any phase encoding schemes and with time-resolved k space segmented imaging. The NMR data is preferably acquired using k space segmented CINE SSFP imaging.

Advantageously, a non-linear phase encoding scheme is used for k space scanning.

It is moreover also possible to combine "Steady State Storage" preparation with SSFP imaging.

In an advantageous variant of the inventive method, k space scanning is performed with reversely centric phase encoding for simultaneous reduction of eddy current and "Steady State Storage" image artefacts.

"Steady State Storage" artefacts can be minimized while at the same time eliminating eddy current effects through selection of suitable k space scanning.

The signal oscillations caused by "Steady State Storage" are transferred to outer regions of the k space through data acquisition with suitable temporal sequence of the phase encoding steps to thereby reduce resulting image artefacts.

Figure 4:
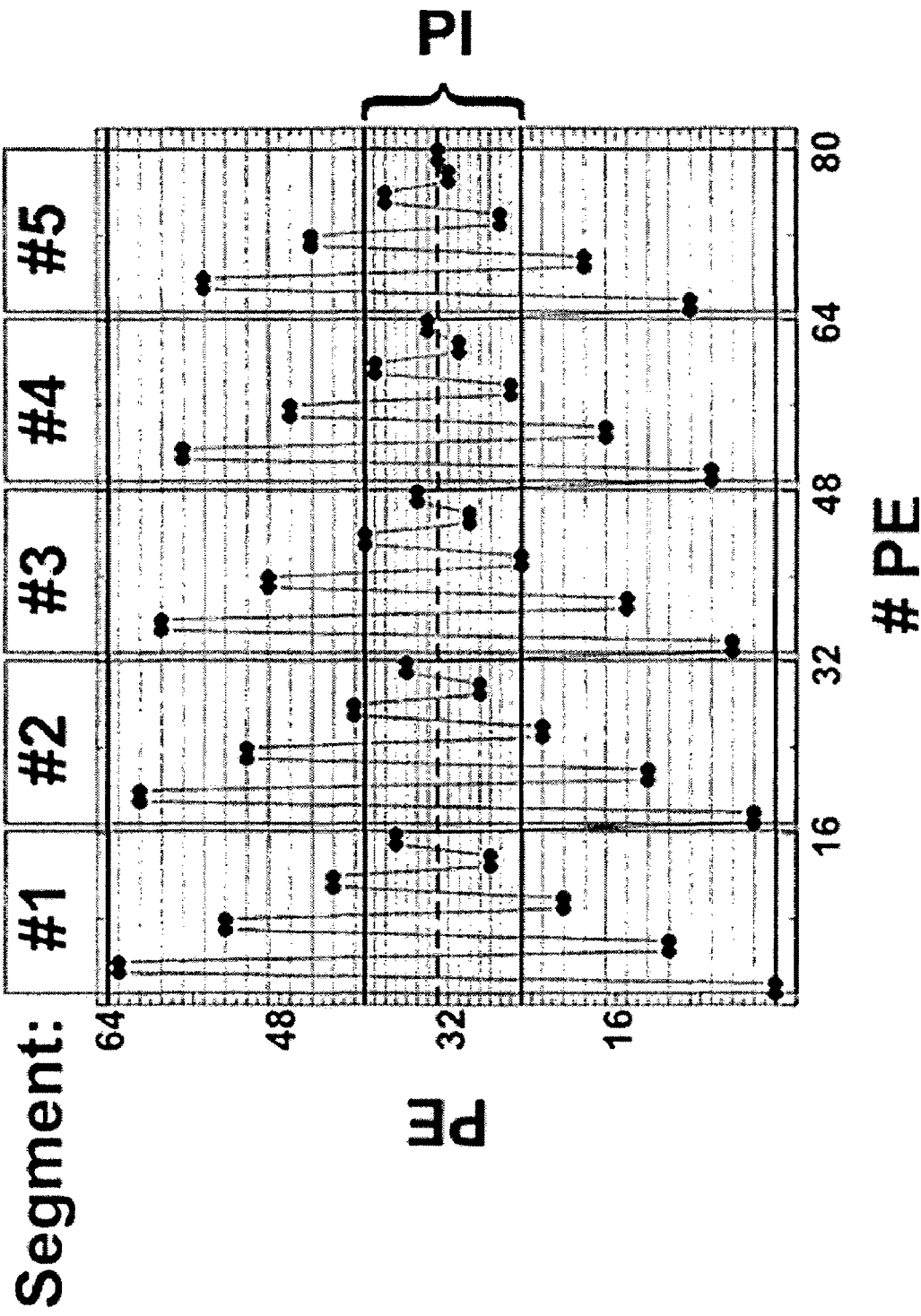
FIG. 4 illustrates the strategy for phase encoding with the inventive method using the example of k space segmented (5 segments) data acquisition with a reversely centric trajectory and in combination with parallel imaging. Potential eddy current effects rsulting from large phase encoding jumps are compensated for through paired acquisition and signal averaging (double average imaging) for each individual phase encoding step (PE). For parallel imaging (PI, compensation of the measuring time extension caused by double average), additional reference data is acquired in the central k space region.

The phase encoding strategy for this purpose is shown in FIG. 4 for a reversely centric phase encoding scheme in combination with parallel imaging (5 segments). Potential eddy current effects resulting from large phase encoding jumps are compensated for through paired acquisition and signal averaging (double average imaging) for each individual phase encoding step (PE). For parallel imaging (PI, compensation of the measuring time extension caused by double average) additional reference data is acquired in the central k space region.

Figure 5:
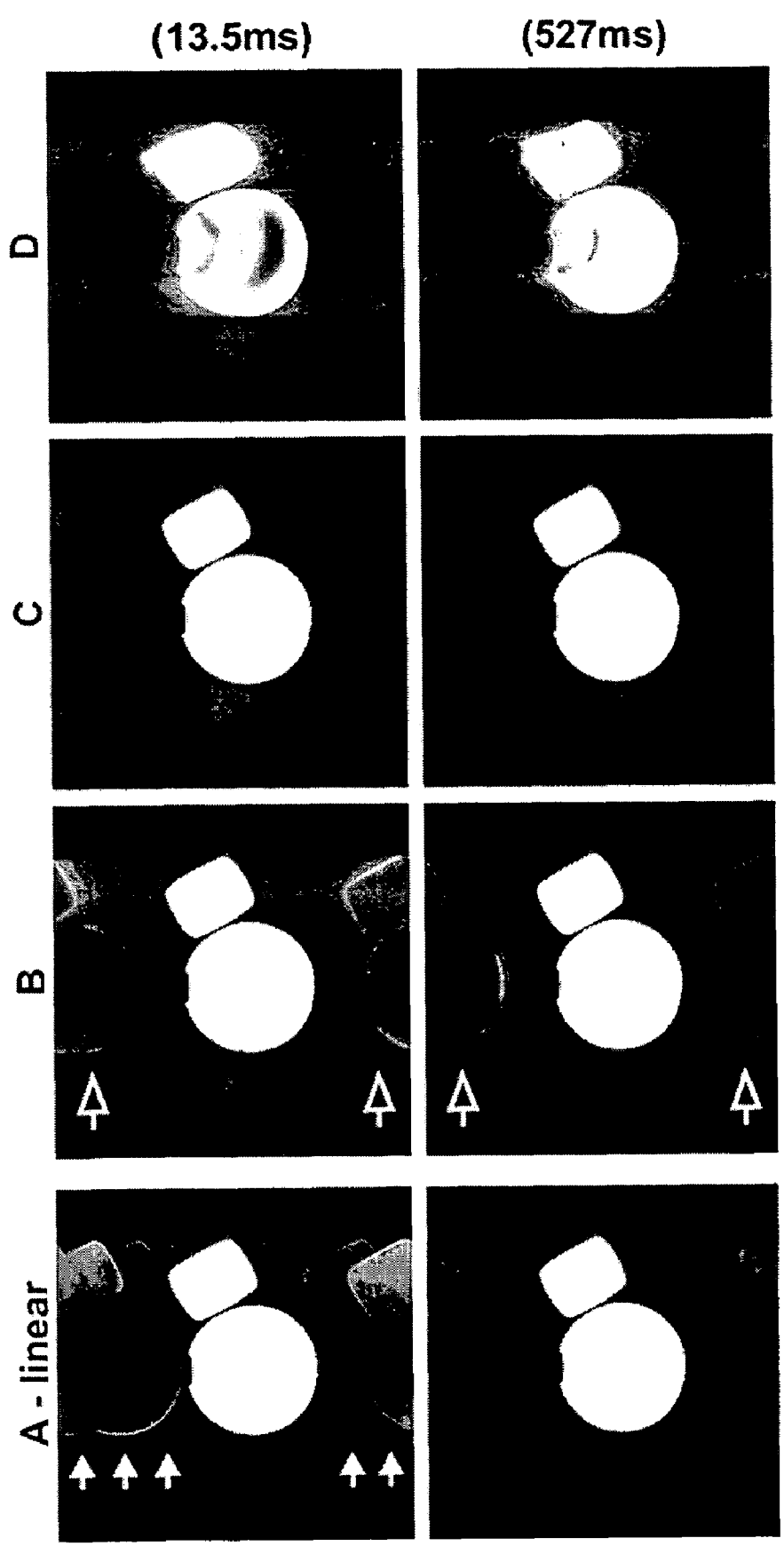
FIG. 5 shows k space segmented CINE SSFP imaging on the phantom with linear (A) and reversely centric k space scanning (B-D) directly after "Steady State Storage" (upper row) and at a later time (lower row). Compared with data acquisition using standard (A) and "paired phase encoding" SSFP imaging, the application of the inventive method (C) considerably reduces image artifacts. Reference (D) also shows strong eddy current artifacts in images with reversely centric k space scanning but without eddy current compensation (i.e. incremental phase encoding).

FIG. 5 shows the function of the combination of the inventive method with parallel imaging, reversely centric k space scanning and segmented data acquisition and "Steady State Storage".

Compared with data acquisition with standard (A) and "paired phase encoding" (B) SSFP imaging, the application of the inventive method (C) has the result that eddy current and "Steady State Storage" image artefacts are simultaneously reduced.

List of Literature

[1] Carr H Y. Steady-State Free Precession in Nuclear Magnetic Resonance. Physical Review 1958;112(5):1693-1701.

[2] Oppelt A, Graumann R, Barfuß H, Fischer H, Hartl W, Schajor W. FISP—a new fast MRI sequence. Electromedica (Engl Ed) 1986;54(54):15-18.

[3] Scheffler K, Lehnhardt S. Principles and applications of balanced SSFP techniques. Eur Radiol 2003;13(11):2409-2418.

[4] Foxall D L. Frequency-modulated steady-state free precession imaging. Magn Reson Med 2002;48(3):502-508.

[5] Bieri O, Scheffler K, In Proc. Intl. 12th Scientific Meeting International Society of Magnetic Resonance in Medicine, Kyotzo, Japan, 2004, Nr. 104

[6] Pruessmann K P, Weiger M, Scheidegger M B, Boesiger P. SENSE: sensitivity encoding for fast MRI. Magn Reson Med 1999;42(5):952-962.

[7] Griswold M A, Jakob P M, Heidemann R M, Nittka M, Jellus V, Wang J, Kiefer B, Haase A. Generalized autocalibrating partially parallel acquisitions (GRAPPA). Magn Reson Med 2002;47(6):1202-1210.

[8] Scheffler K, Heid O, Hennig J. Magnetization preparation during the steady state: fat-saturated 3D TrueFISP. Magn Reson Med 2001;45(6):1075-1080.

We claim:

1. A method for improving SSFP data obtained in a steady state free precession (SSFP) gradient echo procedure, in particular, of nuclear magnetic resonance (NMR) tomography, wherein a regular sequence of radio frequency pulses with flip angle $\alpha$ is applied at temporally constant intervals TR, and wherein the phase of these pulses is increased by a constant phase increment in successive steps, said method comprising:

performing a predetermined phase encoding scheme in such a manner that each individual phase encoding step is identically repeated N times under the following conditions:

N is an even number and $N \geq 2$, i.e. (N=2, 4, 6, 8, . . . );

Successive measured NMR signals are averaged, and wherein, the N-fold measuring time extension which is inherent in the method is completely or partially compensated for by an acceleration factor M through application of parallel imaging in order to minimize artifacts produced through incrementation of phase encoding gradients during production of gradient echo data, generating signals in response to the radio frequency pulses; and transforming the signals into a data image.

2. Method according to claim 1, further comprising in addition to the sequence of radio frequency pulses, magnetic field gradients are applied for encoding an NMR image corresponding to a two-dimensional or even multi-dimensional Fourier transformation method in such a manner that
 a slice is selected through application of a slice selection gradient during the radio frequency pulses,
 a gradient echo is generated through application of a read gradient which is initially switched on in terms of a gradient echo method and the amplitude of which is then reversed,
 before reading out the gradient echo, phase encoding is performed through application of a phase encoding gradient perpendicularly to the read gradient in terms of a two-dimensional Fourier transformation method or through application of several phase encoding gradients in perpendicular directions for phase encoding in terms of a multi-dimensional Fourier transformation method.

3. Method according to claim 1, wherein a non-linear phase encoding scheme is used for k space scanning.

4. Method according to claim 1, wherein the NMR data is recorded using k space segmented CINE SSFP imaging.

5. Method according to claim 1, wherein "Steady State Storage" preparation is combined with SSFP imaging.

6. Method according to claim 1, wherein k space scanning with reversely centric phase encoding is performed for simultaneous reduction of eddy current and "Steady State Storage" image artifacts.

7. Method according to claim 1, wherein the magnetic field gradients are applied in correspondence with image encoding according to the method of filtered back projection.

8. Method according to claim 1, wherein a non-linear phase encoding scheme is used for k space scanning.

9. Method according to claim 1, wherein the NMR data is recorded using k space segmented CINE SSFP imaging.

10. Method according to claim 1, wherein "Steady State Storage" preparation is combined with SSFP imaging.

11. Method according to claim 1, wherein k space scanning with reversely centric phase encoding is performed for simultaneous reduction of eddy current and "Steady State Storage" image artifacts.

12. Method according to claim 1, wherein the magnetic field gradients are applied in correspondence with image encoding according to the method of filtered back projection.

13. A method for improving SSFP data obtained in a steady state free precession (SSFP) gradient echo method, in particular, of nuclear magnetic resonance (NMR) tomography, wherein a regular sequence of radio frequency pulses with flip angle α is applied at temporally constant intervals TR, and wherein the phase of these pulses is increased by a constant phase increment in successive steps, said method comprising:

performing a predetermined phase encoding scheme in such a manner that each individual phase encoding step is identically repeated N times under the following conditions:

N is an even number and N≧2, i.e. (N=2, 4, 6, 8, . . . );

successive measured NMR signals are averaged;

magnetic field gradients are applied for encoding an NMR image corresponding to a two-dimensional or even multi-dimensional Fourier transformation method in such a manner that a slice is selected through application of a slice selection gradient during the radio frequency pulses, a gradient echo is generated through application of a read gradient which is initially switched on in terms of a gradient echo method and the amplitude of which is then reversed, before reading out the gradient echo, phase encoding is performed through application of a phase encoding gradient perpendicularly to the read gradient in terms of a two-dimensional Fourier transformation method or through application of several phase encoding gradients in perpendicular directions for phase encoding in terms of a multi-dimensional Fourier transformation method and wherein the N-fold measuring time extension which is inherent in the method is completely or partially compensated for by an acceleration factor M through application of parallel imaging in order to memorize artifacts produced through incrementation of phase encoding gradient during production of gradient echo data generating signals in response to the radio frequency pulses; and transforming the signals into a data image.

14. Method according to claim 13, wherein a non-linear phase encoding scheme is used for k space scanning.

15. Method according to claim 13, wherein the NMR data is recorded using k space segmented CHINE SSFP imaging.

16. Method according to claim 13, wherein "Steady State Storage" preparation is combined with SSFP imaging.

17. Method according to claim 13, wherein k space scanning with reversely centric phase encoding is performed for simultaneous reduction of eddy current and "Steady State Storage" image artifacts.

18. Method according to claim 13, wherein the magnetic field gradients are applied in correspondence with image encoding according to the method of filtered back projection.

19. Method according to claim 13, wherein a non-linear phase encoding scheme is used for k space scanning.

* * * * *